(12) United States Patent
Hareshbhai Niranjani et al.

(10) Patent No.: US 12,493,062 B2
(45) Date of Patent: Dec. 9, 2025

(54) INTEGRATED CIRCUIT WITH SUPPLY VOLTAGE DETECTOR

(71) Applicant: STMicroelectronics International N.V., Geneva (CH)

(72) Inventors: Mayankkumar Hareshbhai Niranjani, Lathi (IN); Rajesh Narwal, Greater Noida (IN); Pravesh Kumar Saini, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 105 days.

(21) Appl. No.: 18/326,877

(22) Filed: May 31, 2023

(65) Prior Publication Data
US 2024/0405538 A1 Dec. 5, 2024

(51) Int. Cl.
*G01R 19/165* (2006.01)
*H03K 17/22* (2006.01)

(52) U.S. Cl.
CPC . *G01R 19/16552* (2013.01); *G01R 19/16519* (2013.01); *H03K 17/223* (2013.01)

(58) Field of Classification Search
None
See application file for complete search history.

(56) References Cited

U.S. PATENT DOCUMENTS

| | | | |
|---|---|---|---|
| 4,321,489 A | 3/1982 | Higuchi et al. | |
| 5,420,798 A | 5/1995 | Lin et al. | |
| 5,627,493 A | 5/1997 | Takeuchi et al. | |
| 6,246,272 B1 | 6/2001 | Takai | |
| 6,683,481 B1 * | 1/2004 | Zhou | H03K 17/223 327/143 |
| 6,750,683 B2 | 6/2004 | McClure et al. | |
| 7,161,396 B1 * | 1/2007 | Zhou | H03K 17/223 327/143 |
| 7,295,050 B2 * | 11/2007 | Shin | H03K 17/223 327/143 |
| 7,315,187 B2 | 1/2008 | Laulanet et al. | |
| 7,378,886 B2 | 5/2008 | Maher | |
| 7,973,526 B2 * | 7/2011 | Lee | G11C 5/147 323/284 |
| 8,080,983 B2 * | 12/2011 | Lourens | G05F 1/575 323/275 |
| 9,466,337 B1 * | 10/2016 | Pan | G01R 19/16566 |
| 10,069,491 B2 * | 9/2018 | Song | H03K 17/223 |
| 10,191,086 B2 | 1/2019 | Seningen et al. | |

(Continued)

FOREIGN PATENT DOCUMENTS

CN 108649939 B 7/2022

*Primary Examiner* — Jeffrey S Zweizig
(74) *Attorney, Agent, or Firm* — Seed Intellectual Property Law Group LLP

(57) ABSTRACT

A supply voltage detector of an integrated circuit is able to detect the state of a supply voltage upon startup with both high-speed and low overall power consumption. The supply voltage detector includes a comparator that generates an output voltage based on the current state of the supply voltage. The comparator includes a startup current booster that generates a supplemental current for the comparator while the supply voltage is ramping up. The start of current booster stops generating the supplemental current when the supply voltage reaches the expected steady-state value or a selected fraction or portion of the expected steady-state value.

19 Claims, 12 Drawing Sheets

(56) References Cited

U.S. PATENT DOCUMENTS

| | | |
|---|---|---|
| 10,914,761 B2 * | 2/2021 | Endo .................... G05F 1/56 |
| 11,398,782 B2 | 7/2022 | Wang |
| 11,418,187 B1 | 8/2022 | Sahu et al. |
| 2010/0244805 A1 | 9/2010 | Fujita |
| 2016/0191041 A1 | 6/2016 | Chung |
| 2017/0294910 A1 | 10/2017 | Menezes |

* cited by examiner

INTEGRATED CIRCUIT WITH SUPPLY VOLTAGE DETECTOR

BACKGROUND

Technical Field

The present disclosure generally relates to integrated circuits, and more particularly to supply voltage detectors of integrated circuits.

Description of the Related Art

Integrated circuits are generally powered by a supply voltage, often labeled as VDD. The supply voltage may correspond to the primary power source for the integrated circuit. The integrated circuit may include a large number of subsystems such as memory systems, processing systems, analog circuits, logic circuits, and other types of subsystems. In some cases, the integrated circuit may include transistors with relatively low voltage ratings. The voltage rating of the transistor may correspond to a maximum recommended voltage difference between any two terminals of the transistor. If the primary supply voltage of the integrated circuit is higher than the voltage rating of a subset of transistors of the integrated circuit, then it may be beneficial to generate in the integrated circuit a local supply voltage that is lower than the primary supply voltage. This local supply voltage can be provided to subsystems or circuits that include transistors or other components with low voltage ratings.

An integrated circuit may include a supply voltage detector that detects the state of the supply voltage in order to ensure that the supply voltage is sufficiently high before generating the smaller local supply voltage from the primary supply voltage. Supply voltage detector may be particularly useful upon startup of the integrated circuit or upon transitioning from a standby mode to a normal mode. However, it is difficult to design a supply voltage detector that is both power efficient and high performance.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide a supply voltage detector that is able to detect the state of a supply voltage of an integrated circuit upon startup with both high-speed and low overall power consumption. The supply voltage detector includes a comparator that generates an output voltage based on the current state of the supply voltage. The comparator includes a startup current booster that generates a supplemental current for the comparator while the supply voltage is ramping up. The supplemental current enables the comparator to operate rapidly even when the supply voltage is ramping up very quickly. The start of current booster stops generating the supplemental current when the supply voltage reaches the expected steady-state value or a selected fraction or portion of the expected steady-state value. In this way, the supply voltage detector is fast during ramping up of the supply voltage, but does not consume excess power when the supply voltage reaches steady-state.

In one embodiment, the supply voltage detector includes a bias voltage generator. The bias voltage generator may generate multiple bias voltages and provide the bias voltages to the comparator. The comparator can then detect the state of the supply voltage based on the multiple bias voltages and the supply voltage.

In one embodiment, the comparator includes a first stage and a second stage. The first stage may receive two of the bias voltages and may generate a preliminary output voltage based on the two bias voltages. The second stage may receive the preliminary output voltage and third bias voltage and may generate the output voltage based on the preliminary output voltage and the third output voltage.

In one embodiment, the comparator includes a first startup current booster and a second startup current booster. The first startup current booster generates a supplemental current to speed up the first stage of the comparator while the supply voltage is ramping up. The second startup current booster generates a supplemental current to speed up the second stage of the comparator while the supply voltage is ramping up. Both the first startup current booster and the second startup current booster stop generating their supplemental currents when the supply voltage has reached a steady-state.

In one embodiment, a method includes receiving a supply voltage at a comparator of a supply voltage detector of an integrated circuit and generating, with a first startup current booster, a first supplemental current in a first stage of the comparator. The method includes ceasing generation of the supplemental current when the supply voltage ramping up is complete and reaches its final value and generating, with the comparator, an output voltage indicative of a state of the supply voltage.

In one embodiment, a method includes providing a supply voltage to a supply voltage detector of an integrated circuit and generating, with the supply voltage detector, a bias voltage based on the supply voltage. The method includes providing the bias voltage to a comparator of the supply voltage detector and generating, with the comparator, a first supplemental startup current while the supply voltage is increasing. The method includes generating, with the comparator, an output voltage indicative of a state of the supply voltage based on the supply voltage and generating, with the integrated circuit, a local supply voltage lower than the supply voltage based on the output voltage.

In one embodiment, an integrated circuit includes a supply voltage detector including a bias voltage generator configured to generate a first bias voltage based on a supply voltage and a comparator coupled to the bias voltage generator. The comparator is configured to receive the first bias voltage and the supply current and to generate an output voltage indicative of a state of the supply voltage based on the bias voltage. The comparator includes a startup current booster configured to generate a first supplemental current in the comparator.

In one embodiment, an integrated circuit includes a supply voltage detector including a bias voltage generator configured to generate a first bias voltage, a second bias voltage, and a third bias voltage based on a supply voltage and a comparator. The comparator is coupled to the bias voltage generator and is configured to receive the first bias voltage, the second bias voltage, the third bias voltage, and the supply voltage. The comparator includes a first stage configured to receive the first bias voltage and the second bias voltage and to generate a preliminary output voltage based on the first bias voltage and the second bias voltage and including a first boost current generator configured to generate a second supplement current for the first stage while the supply voltage is ramping up. The comparator includes a second stage configured to receive the third bias voltage and the preliminary output voltage and to generate an output voltage based on the third bias voltage and the preliminary output voltage and including a second boost current generator configured to generate a second supplement current for the second stage while the supply voltage is ramping up. The integrated circuit includes a local supply voltage generator configured to generate a local supply voltage from the supply voltage based on the output voltage, the local supply voltage being lower than the supply voltage.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
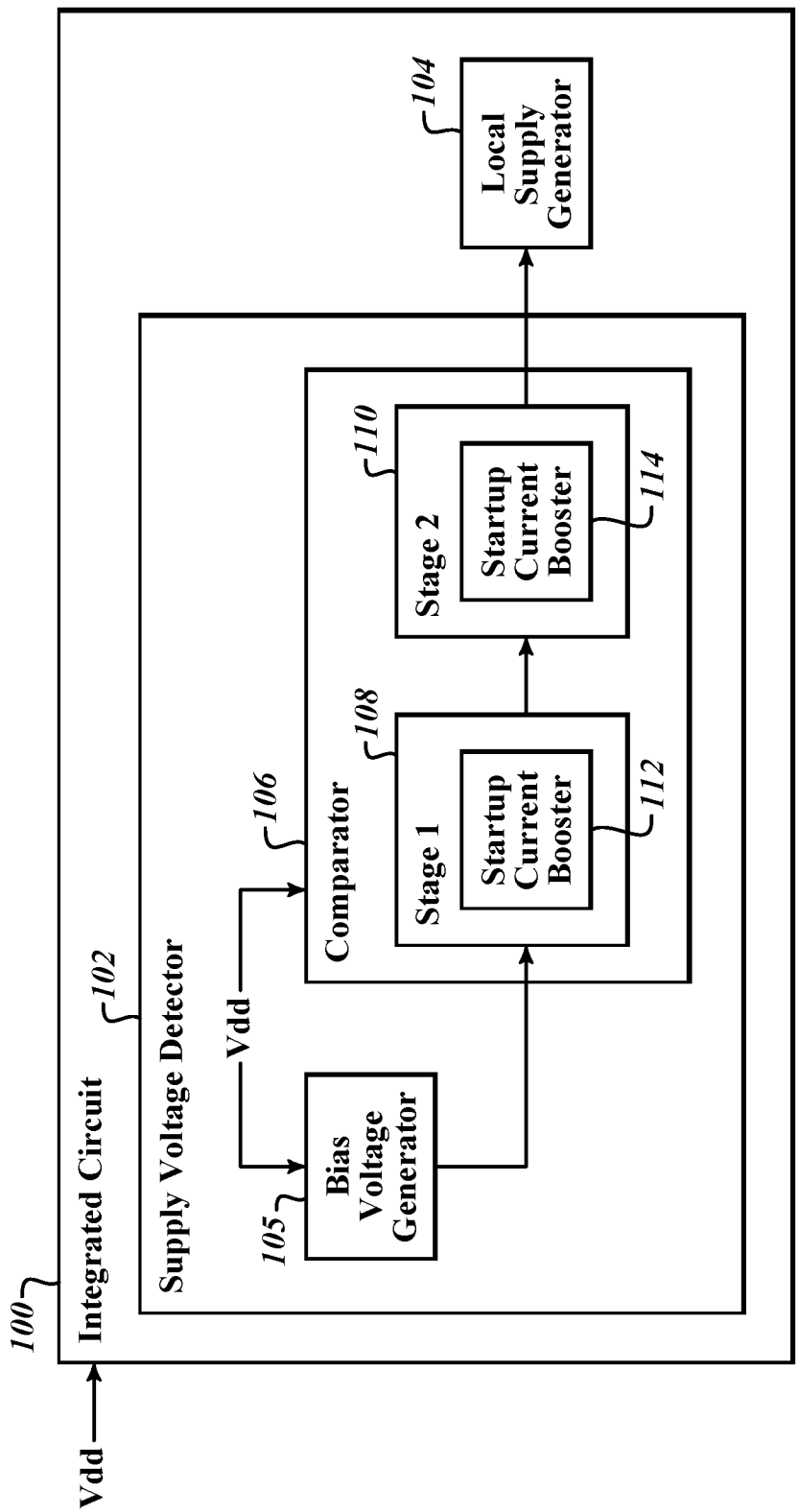
FIG. 1 is a block diagram of an integrated circuit including a supply voltage detector, in accordance with one embodiment.

FIG. 1 is a block diagram of an integrated circuit 100, in accordance with one embodiment. The integrated circuit 100 receives a supply voltage VDD. The integrated circuit 100 includes a supply voltage detector 102 and a local supply generator 104. As will be set forth in more detail below, the components of the integrated circuit 100 cooperate to quickly detect the state of the supply voltage VDD in a power efficient manner.

In one embodiment, the integrated circuit 100 is a system on chip (SOC). In many cases, such an integrated circuit may include a large number of subsystems such as memory systems, processing systems, logic circuits, analog circuits, and other types of subsystems. The various subsystems of integrated circuit 100 may call for transistors having different voltage ratings. As used herein, a voltage rating corresponds to a maximum safe voltage difference that may appear across terminals of a transistor without damaging the transistor. The supply voltage VDD may be larger than the voltage rating of some of the transistors of the SOC. For example, core transistors, such as the transistors that make up processing and logic circuitry, are often relatively small in order to enable low power operation and the high transistor density. This may result in relatively low voltage ratings for the core transistors.

The local supply generator 104 may receive the supply voltage VDD and may generate a local supply voltage that is smaller than VDD. The local supply voltage may correspond to a voltage that is provided to subsystems of include transistors with low voltage ratings. The magnitude of the local supply voltage is chosen to be lower than the voltage rating of the lowest rated transistors.

When integrated circuit 100 is in a startup phase, the supply voltage may not yet be near its expected maximum voltage. In particular, the supply voltage VDD typically ramps up from zero voltage to an expected supply voltage level upon startup. As used herein, startup can refer to any instance in which the supply voltage of the integrated circuit 100 ramps up from substantially 0 V to the expected supply voltage level. Accordingly, startup may include instances in which the integrated circuit is exiting a standby mode or a deep standby mode in which the supply voltage VDD is not available.

In many cases it is beneficial to prevent the local supply generator 104 from generating the local supply voltage until the supply voltage VDD has reached the expected supply value, or some percentage or proportion of the expected supply value. The integrated circuit 100 utilizes the supply voltage detector 102 to detect the state of the supply voltage VDD and to indicate to the local supply generator that the supply voltage VDD has reached a level at which it is safe to generate the local supply voltage.

In some cases, the supply voltage VDD may ramp up to the expected value very rapidly. In these cases, it is beneficial if the supply voltage detector 102 is able to rapidly detect and provide indication to the local supply generator 104 that the supply voltage VDD has reached the expected value or the acceptable proportion of the expected value.

However, it can be difficult to rapidly detect and indicate that the supply voltage VDD is ready for use in generating the local supply voltage without causing large amounts of power consumption throughout use of the integrated circuit 100. The supply voltage detector 102 is able to rapidly detect and indicate that the supply voltage is ready while maintaining low power consumption.

The supply voltage detector 102 includes a bias generator 105 and the comparator 106. The bias generator 105 and the comparator 106 each receive the supply voltage VDD. Said another way, the bias voltage generator 105 and the comparator 106 are powered by the supply voltage VDD. The bias voltage generator generates one or more bias voltages from the supply voltage VDD and supplies these bias voltages to the comparator 106. One of the bias voltages may correspond to the level of the local supply voltage.

The comparator 106 receives the one or more bias voltages and generates an output voltage based on the one or more bias voltages and the level of the supply voltage detector 102. The comparator 106 generates an output voltage or output signal that indicates whether or not the supply voltage VDD is at a desired or acceptable level. The comparator 106 passes the output voltage to the local supply generator 104. The level of the output voltage indicates to the local supply generator 104 whether or not the supply voltage VDD is at a level sufficient for generating the local supply voltage.

In one embodiment, the comparator 106 includes a first stage 108 and a second stage 110. The first stage 108 receives one or more of the bias voltages generated by the bias voltage generator 105 and generates a preliminary output voltage based on the one or more bias voltages and the supply voltage VDD. The first stage 108 passes the preliminary output voltage to the second stage 110. The first stage 108 may correspond to a first comparator.

The second stage 110 receives the preliminary output voltage, the supply voltage, and one or more of the bias voltages. The second stage 110 generates the output voltage based on the preliminary output voltage, the supply voltage, and one or more of the bias voltages.

In one embodiment, the output of the comparator 106 will stay low until the supply voltage is greater than a threshold voltage. The threshold voltage may correspond to a selected voltage that is some acceptable proportion of the full supply voltage for generating the local supply voltage. The threshold voltage may be implemented via one or more of the bias voltages. In one embodiment, after the supply voltage has crossed the threshold voltage, the output of the comparator 106 follows the level of the supply voltage VDD. For example, if the threshold voltage is 2 V and the expected level of VDD is 3.6 V, then the output voltage will remain low (e.g., substantially 0 V), until the supply voltage VDD crosses 2 V. The output voltage will then go high and will be substantially equal to the value of the supply voltage VDD.

Accordingly, as the supply voltage continues to ramp upward from 2 V to 3.6 V, the output voltage will also ramp upwards toward 3.6 V.

In order to enable the output voltage of the comparator 106 to track the supply voltage VDD when the supply voltage VDD is ramping up rapidly (e.g., from 0 V to 3.6 V in less than 50 µs), the comparator 106 includes startup current boosters 112 and 114. More particularly, the first stage 108 of the comparator 106 includes the startup current booster 112. The second stage 110 of the comparator 106 includes the startup current booster 114.

Because the various circuit nodes within the comparator 106 have capacitance, some amount of time may be utilized to charge the nodes to the desired voltage levels. If the comparator 106 generates only small voltages, then the capacitive nodes may not charge quickly enough to enable the comparator 106 to track the rapid increase in the supply voltage VDD. Accordingly, the comparator 106 utilizes one or both of the startup current booster 112 and the startup current booster 114 to generate supplemental currents to rapidly charge up capacitive nodes when the supply voltage VDD is rapidly increasing.

The startup current booster 112 generates a first supplemental current for the first comparator stage 108. Advantageously, in one embodiment, the startup current booster 112 only generates the supplemental current when a startup condition is present such that the supply voltage VDD is increasing but has not yet reached the full expected value. In this condition, the startup current booster 112 generates the first supplemental current that adds to the standard currents generated by the first stage 108 and enables rapid charging of capacitive nodes.

In one embodiment, the startup current booster 114 generates a second supplemental current for the second comparator stage 110. Advantageously, in one embodiment, the startup current booster 114 only generates the supplemental current when a startup condition is present such that the supply voltage VDD is increasing but has not reached the full expected value. In this condition, the startup current booster 114 generates the second supplemental current that adds to the standard currents generated by the second stage 110 and enables rapid charging of capacitive nodes. The result is that the comparator 106 is able to generate an output voltage that accurately tracks the rapidly increasing supply voltage VDD.

In one embodiment, once the supply voltage VDD has arrived at the expected voltage level, the startup current boosters 112 and 114 stop generating the supplemental current. This is highly beneficial because this enables the comparator 106 to consume very little power between startup operations because the supplemental currents are only present during the startup operations.

Although FIG. 1 illustrates both a startup current booster 112 and the startup current booster 114, in practice, the comparator 106 may have only a single startup current booster. Likewise, the comparator 106 may only have a single stage. Various configurations of the comparator 106 can be implemented in accordance with principles of the present disclosure without departing from the scope of the present disclosure.

Figure 2A:
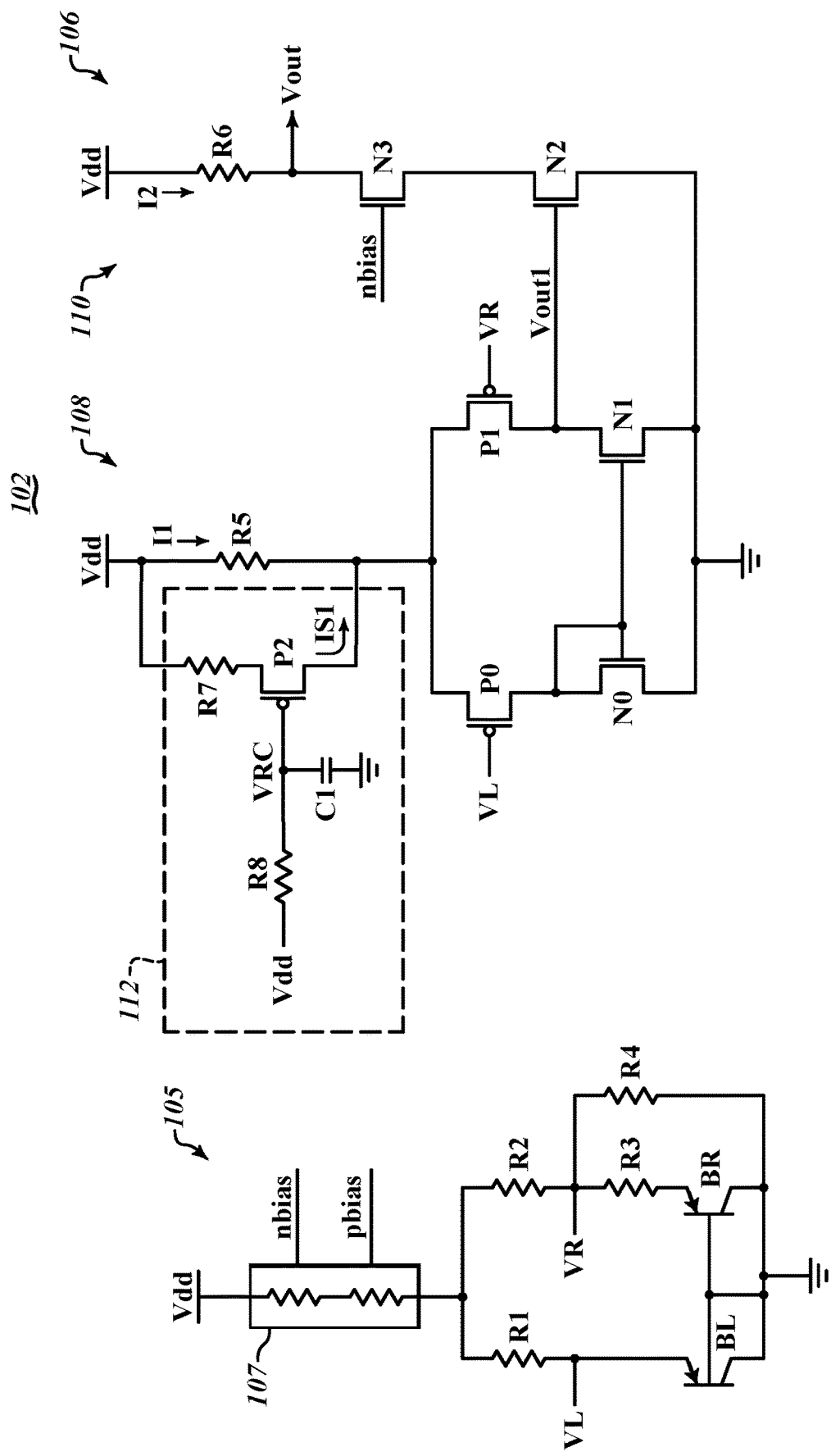
FIG. 2A is a schematic diagram of a supply voltage detector of an integrated circuit, in accordance with one embodiment.

FIG. 2A is a schematic diagram of a supply voltage detector 102, in accordance with one embodiment. The supply voltage detector 102 of FIG. 2A is one example of a supply voltage detector 102 of FIG. 1.

The supply voltage detector of FIG. 2A includes a bias voltage generator 105. In FIG. 2A, the bias voltage generator 105 generates four bias voltages: nbias, pbias, VL, and VR.

The bias voltage generator 105 has a first power supply rail that receives the supply voltage VDD. The bias voltage generator 107 includes a resistor chain 107. The resistor chain 107 includes a plurality of resistors that can act as a voltage divider for generating the bias voltages nbias and pbias.

In a nonlimiting examples given herein in relation to FIGS. 2A-9, the expected value of VDD is 3.6 V. However, other values and VDD can be utilized without departing from the scope of the present disclosure. In these examples, the bias voltage nbias may be approximately 2.3 V. The bias voltage pbias may be different or the same as the bias voltage nbias. Other values can be utilized for the bias voltages nbias and pbias without departing from the scope of the present disclosure.

The bias voltage generator 105 includes a first PNP bipolar transistor BL having a collector terminal coupled to ground, a base terminal coupled to ground, and an emitter terminal coupled to a resistor R1. The resistor R1 is coupled between the emitter terminal of the transistor BL and the resistor chain 107. The bias voltage generator 105 generates a bias voltage VL at the emitter terminal of the transistor BL.

The bias voltage generator 105 includes a second PNP bipolar transistor BR having a collector terminal coupled to ground, a base terminal coupled to ground, and an emitter terminal coupled to a resistor R3. A resistor R2 is coupled between the resistor R3 and the resistor chain 107. A resistor R4 is coupled between the resistor R2 and ground. The bias voltage generator 105 generates a bias voltage VR at the node between the resistors R2 and R3.

If the supply voltage VDD is ramping up to 3.6 V, then VL will be about one Vbe (base-emitter voltage) of the transistor BL if the supply voltage VDD is high enough. Initially, VL will follow the supply voltage VDD until it reaches 1 Vbe. Due to the resistors R3 and R4, VR will be less then VL until the supply voltage VDD has ramped up nearly all the way. At this point, VR passes VL (see FIG. 2B and the corresponding description).

The comparator 106 includes a first stage 108. The first stage 108 includes a high supply rail that receives the supply voltage VDD. A resistor R5 is coupled to the supply voltage VDD. The first stage 108 includes a PMOS transistor P0 and a PMOS transistor P1. The source terminals of the transistors P0 and P1 correspond to a common source node and are coupled to the resistor R5. The gate terminal of the transistor P0 receives the bias voltage VL. The gate terminal of the transistor P1 receives the bias voltage VR. The first stage 108 includes NMOS transistors N0 and N1. The NMOS transistors N0 and N1 have a common source terminal coupled to ground and a common gate terminal coupled to the drain terminals of N0 and P0. The drain terminal of N1 is coupled to the drain terminal of P1 and corresponds to an output of the first stage 108. In particular, the first stage 108 generates a preliminary output voltage Vout1. The first stage 108 also includes a startup current booster 112 to be described further below.

The comparator 106 includes a second stage 110. The second stage 110 includes a supply voltage rail that receives the supply voltage VDD. The second stage 110 includes a resistor R6 coupled between the supply voltage VDD and the output terminal of the second stage 110. The output terminal of the second stage 110 corresponds to the output terminal of the comparator 106 and provides an output voltage Vout corresponding to the output of the comparator 106. The comparator 106 includes a transistor N2 having a source terminal coupled to ground and a gate terminal coupled to the output of the first stage 108. Accordingly, the gate terminal of N2 receives the preliminary output voltage. The second stage 110 includes a transistor N3 having a source terminal coupled to the drain terminal of the transistor N2, a gate terminal that receives the bias voltage nbias, and a drain terminal coupled to the resistor R6.

In order to illustrate some benefits of principles of the present disclosure, function of the comparator 106 will initially be described as though the startup current booster 112 is not present. When the supply voltage VDD initially begins to ramp up, a current will begin to flow through the resistor R5 to the common source terminals of P0 and P1. VL and VR will begin to increase. Initially VL will be greater than VR as the supply voltage VDD ramps up. This causes the preliminary output voltage to be low until VR exceeds VL, causing the preliminary voltage to go high. The level of the supply voltage VDD at which VR passes VL corresponds to a threshold voltage of the comparator 106. The output voltage Vout switches from low to high when the supply voltage VDD crosses the threshold voltage. Once the output voltage Vout goes high, the output voltage Vout tracks (remains substantially equal to) the supply voltage VDD.

As described previously, each of the nodes in the first stage 108 has some nonzero capacitance. In the absence of the startup current booster 112, the charging time of the nodes is based on the current I1 flowing through the resistor R5. However, in order to maintain low power consumption, the resistor R5 may be very large (e.g., about 10 megohms). The result is that I1 is relatively small. A relatively small I1 is beneficial after the supply voltage VDD has ramped up to the expected voltage. However, during the ramping up period, the relatively small level of I1 results in an inability for the output voltage to track the supply voltage VDD if the supply voltage VDD is ramping up very rapidly.

The startup current booster 112 generates a supplemental current IS1 while the supply voltage VDD is ramping up. In the embodiment of FIG. 2A, the startup current booster 112 includes a resistor R7 and a transistor P2 coupled together in parallel with the resistor R5. In particular, the drain terminal of the transistor P2 is coupled to the common source terminal of P0 and P1. The source terminal of the transistor P2 is coupled to the resistor R7. The resistor R7 is coupled between the source terminal of the transistor P2 and the supply voltage rail VDD. The startup current booster 112 includes a resistor R8 coupled between VDD and the gate terminal of the transistor P2. The startup current booster 112 includes a capacitor C1 coupled between the gate terminal of the transistor P2 and ground.

During a startup operation in which VDD is ramping up from 0 V to the expected voltage, the voltage VRC at the gate terminal of the transistor P2 will follow the supply voltage VDD, but with a delay. The delay is based on the current flowing through the resistor R8 that charges the capacitor C1. Accordingly, during startup, the transistor P2 will turn on because the voltage at the gate terminal of P2 will be lower than the voltage at the source terminal of the transistor P2. The result is that the first supplemental current IS1 will begin to flow through the transistor P2 into the common source terminal of the transistors P0 and P1. When the supply voltage VDD reach a steady state and the capacitor C1 is charged, the transistor P2 will turn off, thereby ceasing generation of the supplemental current IS1.

Figure 2B:
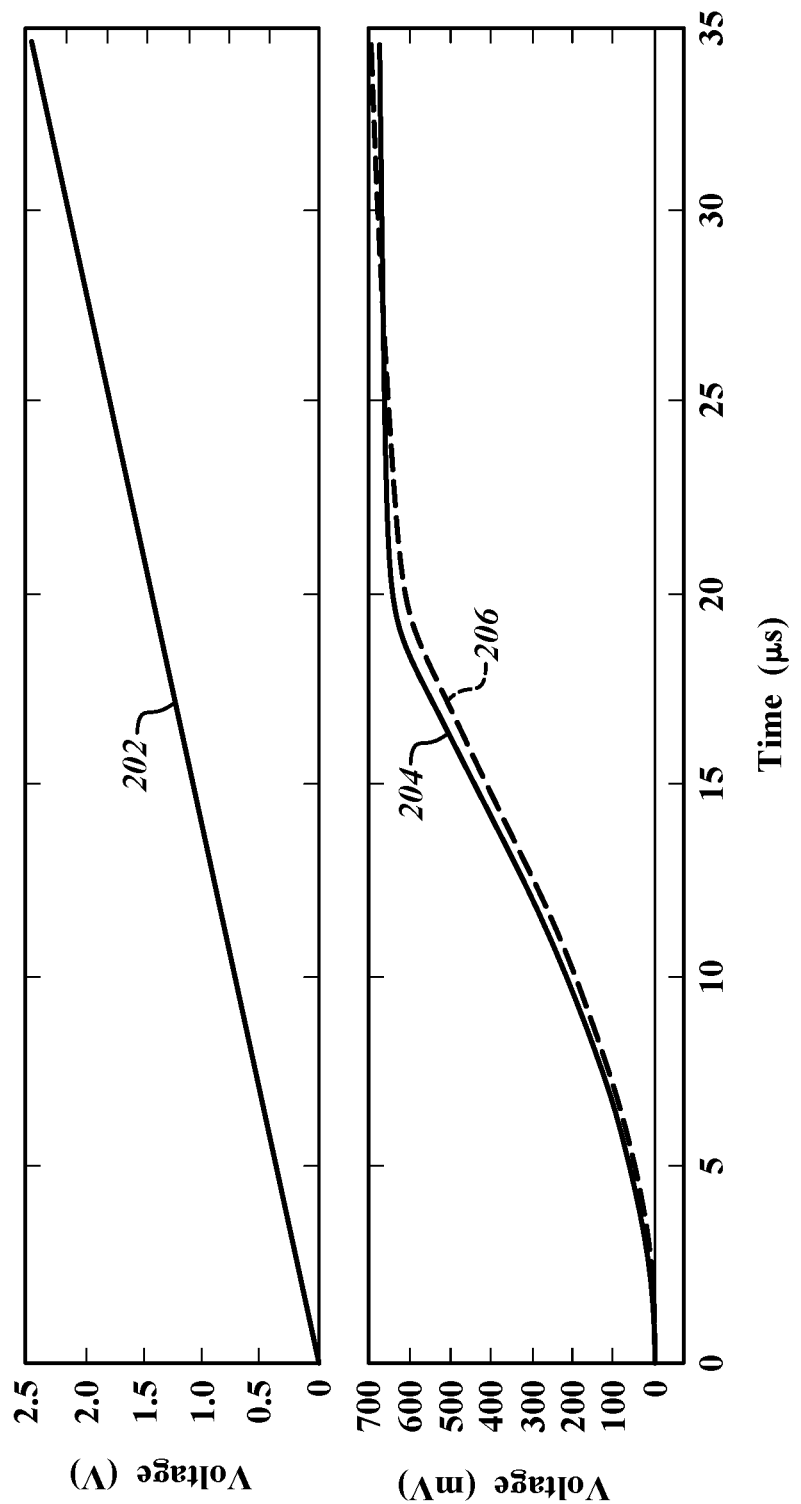
FIG. 2B includes graphs associated with the voltage detector of FIG. 2A, according to one embodiment.

FIG. 2B includes graphs associated with the voltage detector 102 of FIG. 2A, according to one embodiment. A graph 202 illustrates the supply voltage ramping up from 0 V to about 2.6 V within about 35 μs. Graph 204 illustrates the voltage VL. Graph 206 illustrates the voltage VR. As can be seen in FIG. 2B, VR is lower than VL until VR passes VL at about 28 μs.

Figure 3:
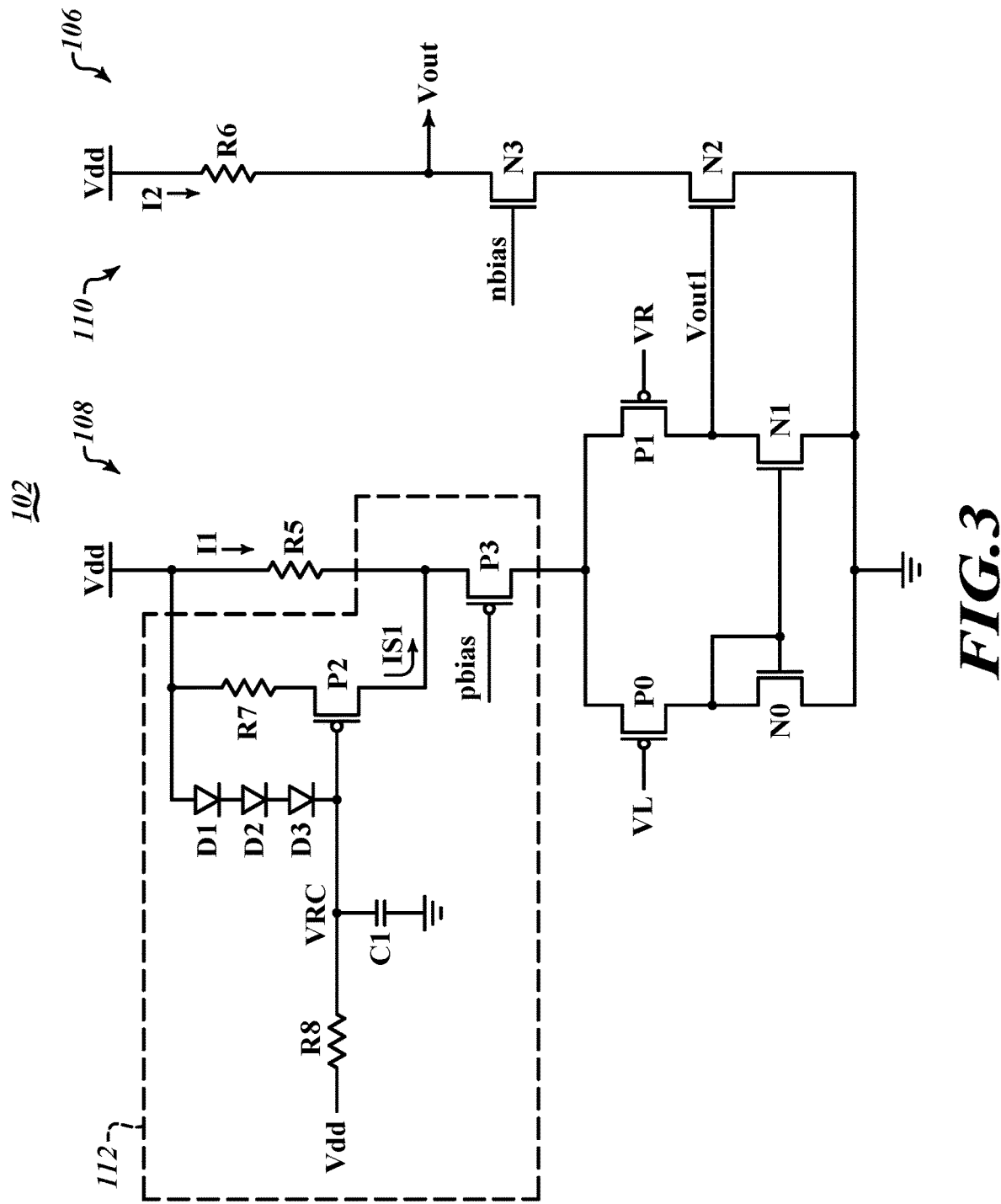
FIG. 3 is a schematic diagram of a supply voltage detector of an integrated circuit, in accordance with one embodiment.

FIG. 3 is a schematic diagram of a supply voltage detector 102, according to one embodiment. The supply voltage detector 102 of FIG. 3 is one example of a supply voltage detector 102 of FIG. 1. The supply voltage detector 102 of FIG. 3 is substantially similar to the supply voltage detector 102 of FIG. 2A, except that the startup current booster 112 is modified with respect to FIG. 2A.

In an example in which the supply voltage is 3.6 V, it is possible that the common source terminal of P0 P1 will be between one voltage 1.1 V. This can result in the gate to drain voltage of the transistor P2 being around 2.5 V. If the transistor P2 has a low voltage rating, is possible that the transistor P2 can be stressed. Furthermore, if the charging delay of the capacitor C1 is large enough, then a high gate to source voltage can also appear on the transistor P2 of the transistor Accordingly, in FIG. 3, the transistor P3 and a plurality of diodes D1, D2, and D3 have been added into the startup current booster 112.

The transistor P3 as a source terminal coupled to the drain terminal of the transistor P2 and a drain terminal coupled to the common source terminals of P0 and P1. The gate terminal of the transistor P3 receives the bias voltage pbias shown in FIG. 2A. The transistor P3 and the bias voltage pbias help ensure that the gate to drain voltage of the transistor P2 is not high enough to stress the transistor P2.

The diodes D1, D2, and D3 are connected in series between the supply voltage VDD and the gate terminal of the transistor P2. If the forward bias voltage of each of the diodes D1-D3 is about 0.7 V. the nearly a maximum voltage drop of about 2 V between the source terminal of the transistor P2 and the gate terminal of the transistor P2.

Figure 4:
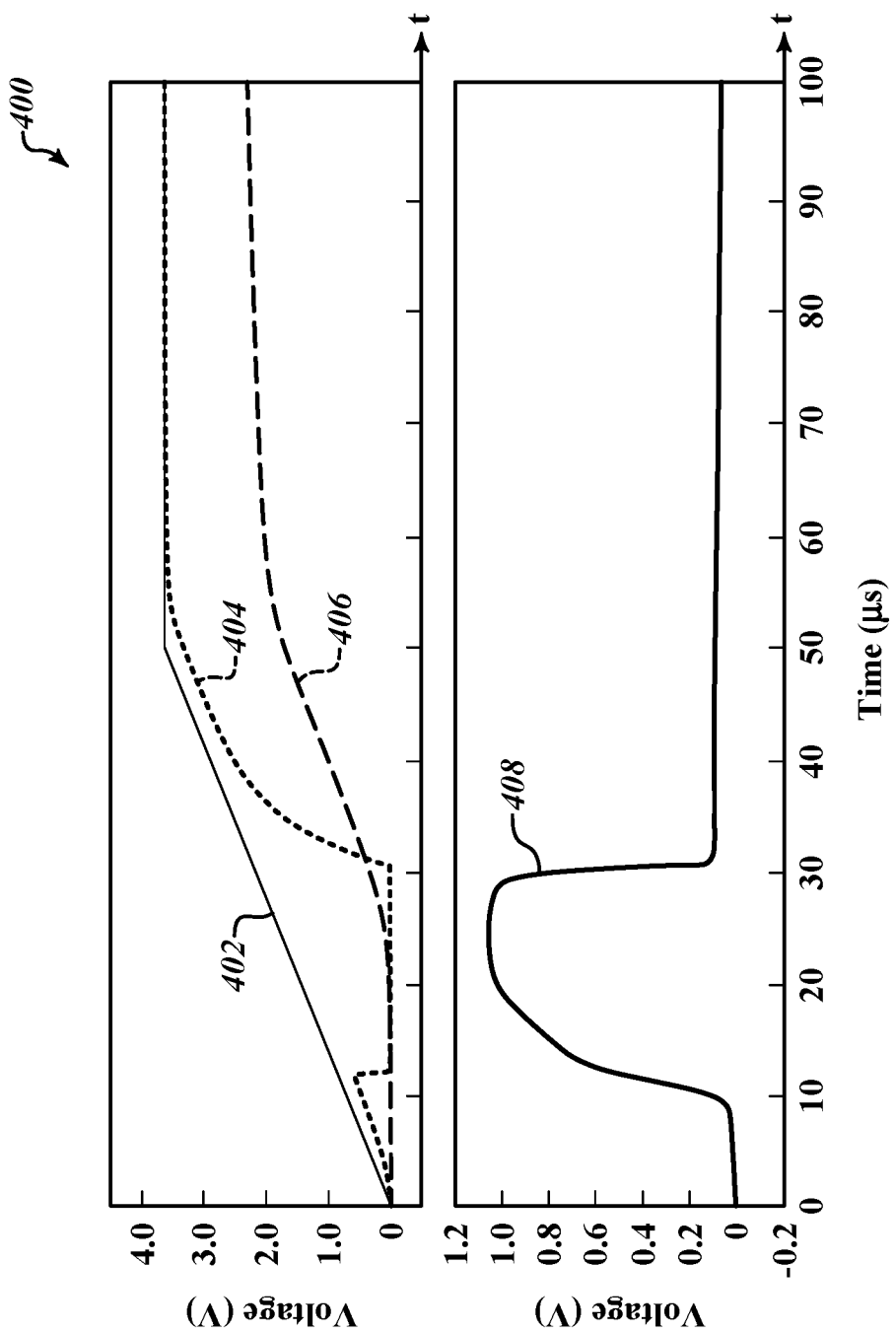
FIG. 4 illustrates graphs of signals associated with a supply voltage detector of an integrated circuit, in accordance with one embodiment.

FIG. 4 is a graph 400 illustrating signals associated with the supply voltage detector 102 of FIG. 3, according to one embodiment. The curve 402 illustrates the supply voltage VDD to ramping up from 0 to 3.6 V in about 50 μs. The curve 404 illustrates the output voltage Vout of the comparator 106. The curve 406 illustrates VRC at the gate terminal of the transistor P2. The curve 408 illustrates the preliminary output voltage Vout1 of the first stage 108 of the comparator 106.

As can be seen in FIG. 4, the output voltage (408) snaps sharply from high to low when the supply voltage crosses the threshold (2V). However, the output voltage (404) does not rise as sharply once the threshold voltage is crossed at about 31 μs. This is because even if Vout1 goes to 0 V. Vout may ramp up through a very high resistance path.

Figure 5:
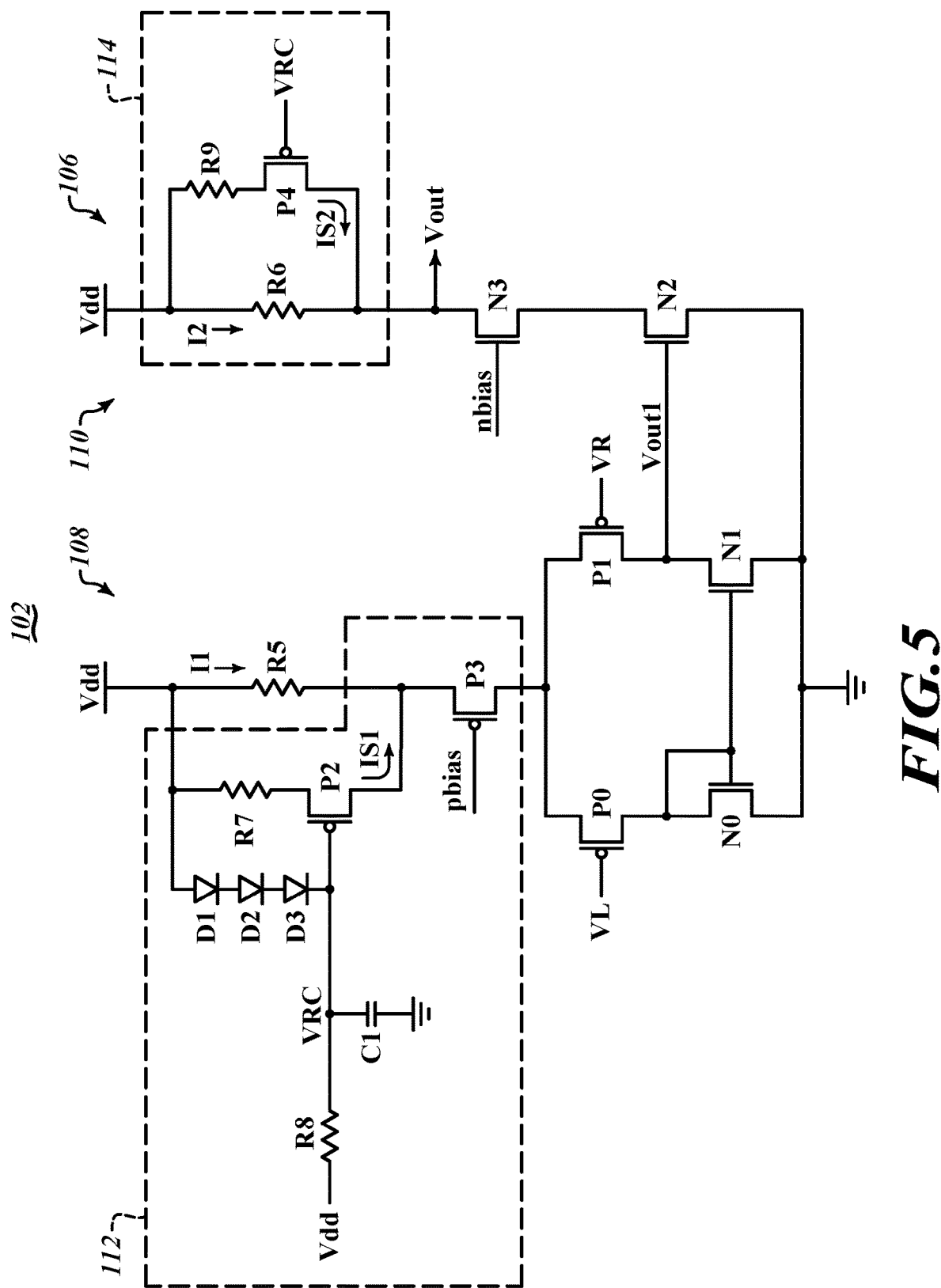
FIG. 5 is a schematic diagram of a supply voltage detector of the integrated circuit, in accordance with one embodiment.

FIG. 5 is a schematic diagram of a supply voltage detector 102, according to one embodiment. The supply voltage detector 102 of FIG. 5 is one example of a supply voltage detector 102 of FIG. 1. The supply voltage detector 102 of FIG. 5 is substantially similar to the supply voltage detector 102 of FIG. 3, except that the second stage 110 includes the startup current booster 114.

As described previously, each of the nodes in the second stage 110 has some nonzero capacitance. In the absence of the startup current booster 114, the charging time of the nodes is based on the current I2 flowing through the resistor R6. However, in order to maintain low power consumption, the resistor R6 may be very large (e.g., about 10 megohms). The result is that I2 is relatively small. A relatively small I2 is beneficial after the supply voltage VDD has ramped up to the expected voltage. However, during the ramping up period, the relatively small level of I2 results in an inability for the output voltage to track the supply voltage VDD if the supply voltage VDD is ramping up very rapidly.

The startup current booster 114 generates a supplemental current IS2 while the supply voltage VDD is ramping up. In the embodiment of FIG. 5, the startup current booster 114 includes a resistor R9 and a transistor P4 coupled together in parallel with the resistor R6. In particular, the drain terminal of the transistor P4 is coupled to the output terminal of the comparator 106. The source terminal of the transistor P4 is coupled to the resistor R9. The resistor R9 is coupled between the source terminal of the transistor P4 and the supply voltage rail VDD. The gate terminal of the transistor P4 is coupled to the gate terminal of the transistor P2 and, therefore, receives the voltage VRC.

During a startup operation in which VDD is ramping up from 0 V to the expected voltage, the voltage VRC at the gate terminal of the transistor P4 will follow the supply voltage VDD, but with a delay. The delay is based on the current flowing through the resistor R8 that charges the capacitor C1. Accordingly, during startup, the transistor P4 will turn on because the voltage at the gate terminal of P4 will be lower than the voltage at the source terminal of the transistor P4. The result is that the second supplemental current IS2 will begin to flow through the transistor P4 into the source terminal of the transistor N3. When the supply voltage VDD reach a steady state and the capacitor C1 is charged, the transistor P4 will turn off, thereby ceasing generation of the supplemental current IS2.

Figure 6:
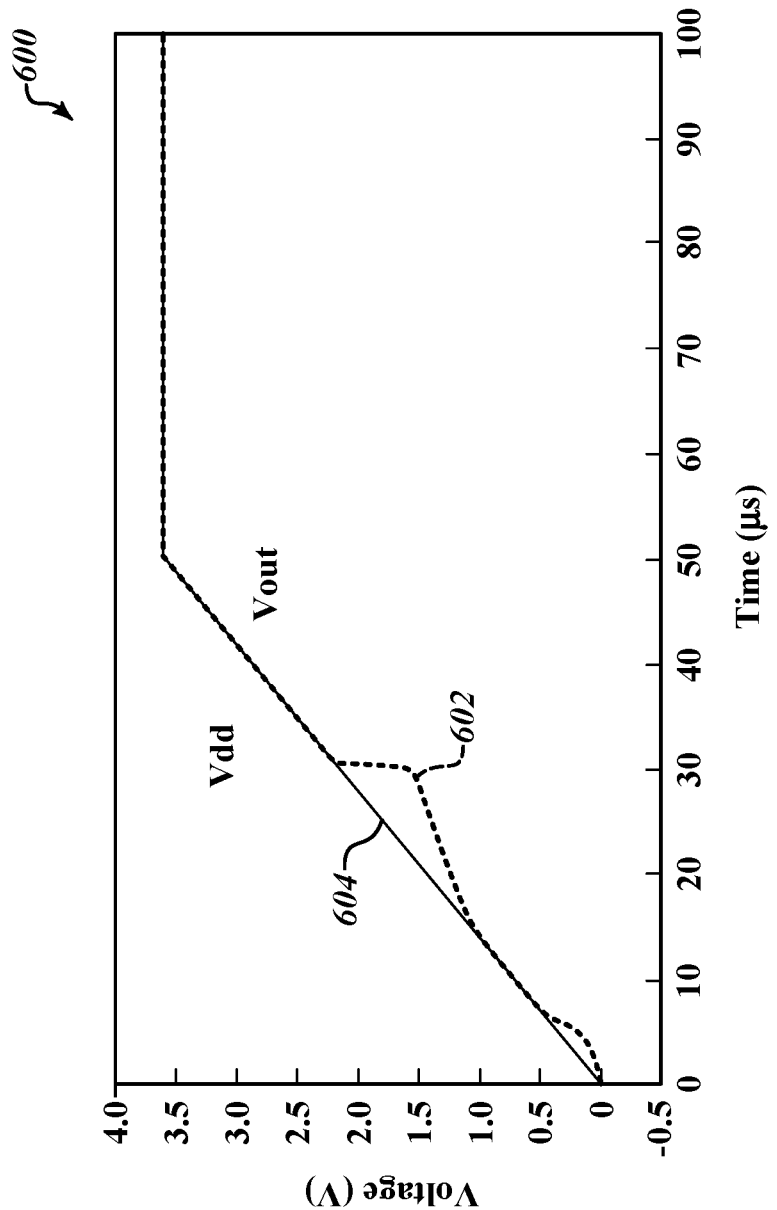
FIG. 6 illustrates graphs of signals associated with a supply voltage detector of an integrated circuit, in accordance with one embodiment.

FIG. 6 is a graph 600 illustrating signals associated with the supply voltage detector 102 of FIG. 5, according to one embodiment. The curve 602 illustrates the output voltage Vout of the comparator while the curve 604 illustrates supply voltage VDD ramping up from 0V to about 3.6 V in about 50 μs. As can be seen, the output voltage Vout will quickly match the supply when the threshold voltage is crossed.

Figure 7:
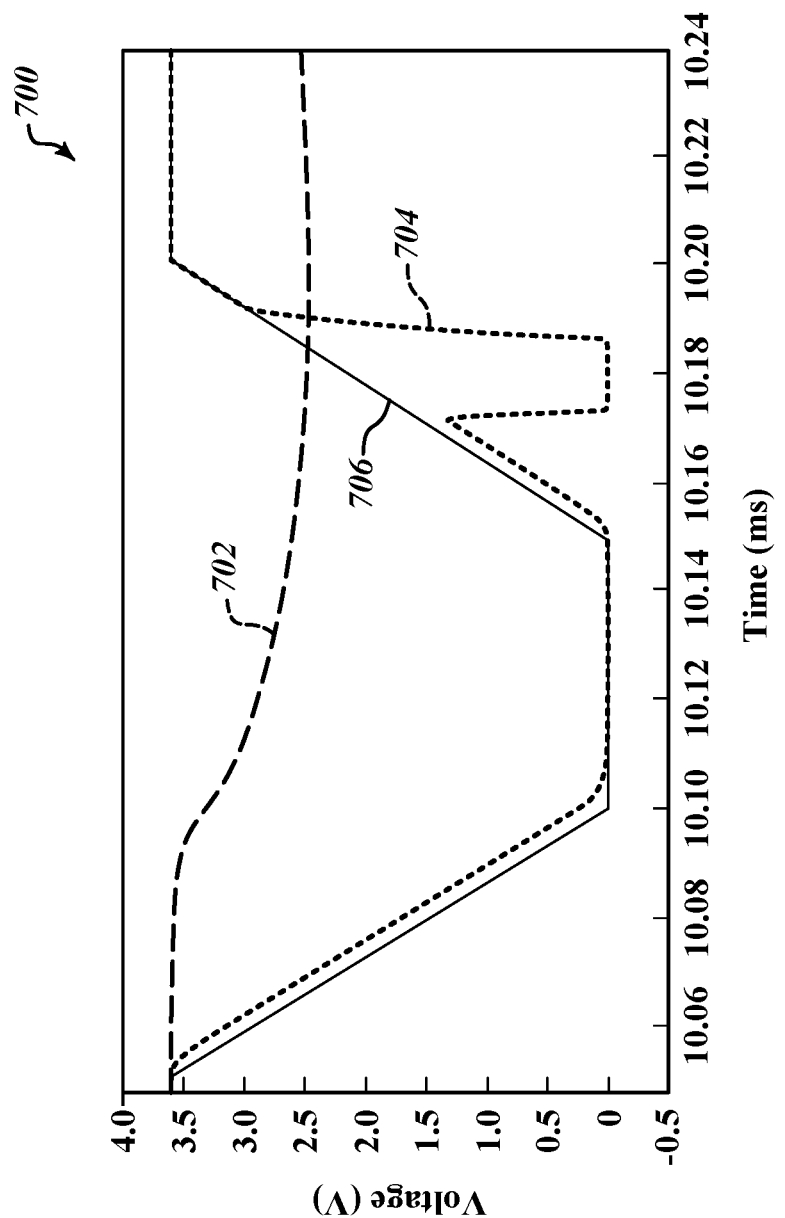
FIG. 7 illustrates graphs of signals associated with a supply voltage detector of an integrated circuit, in accordance with one embodiment.

FIG. 7 is a graph 700 illustrating signals associated with the supply voltage detector 102 of FIG. 5, according to one embodiment. In FIG. 7, the curve 702 illustrates VRC, 704 illustrates the output voltage Vout, and 706 illustrates the supply voltage. In some situations, the supply voltage 706 may ramp down and then ramp up again as shown in FIG. 7. In this scenario VRC (curve 702) was charged to the supply voltage VDD, but will not be quickly discharged as VDD discharges. Accordingly, if the power supply begins to ramp up again VRC is still higher and so the transistors P2 and P4 will be off, possibly resulting in a slow response of the comparator 106. Furthermore, P2 may become stressed.

Figure 8:
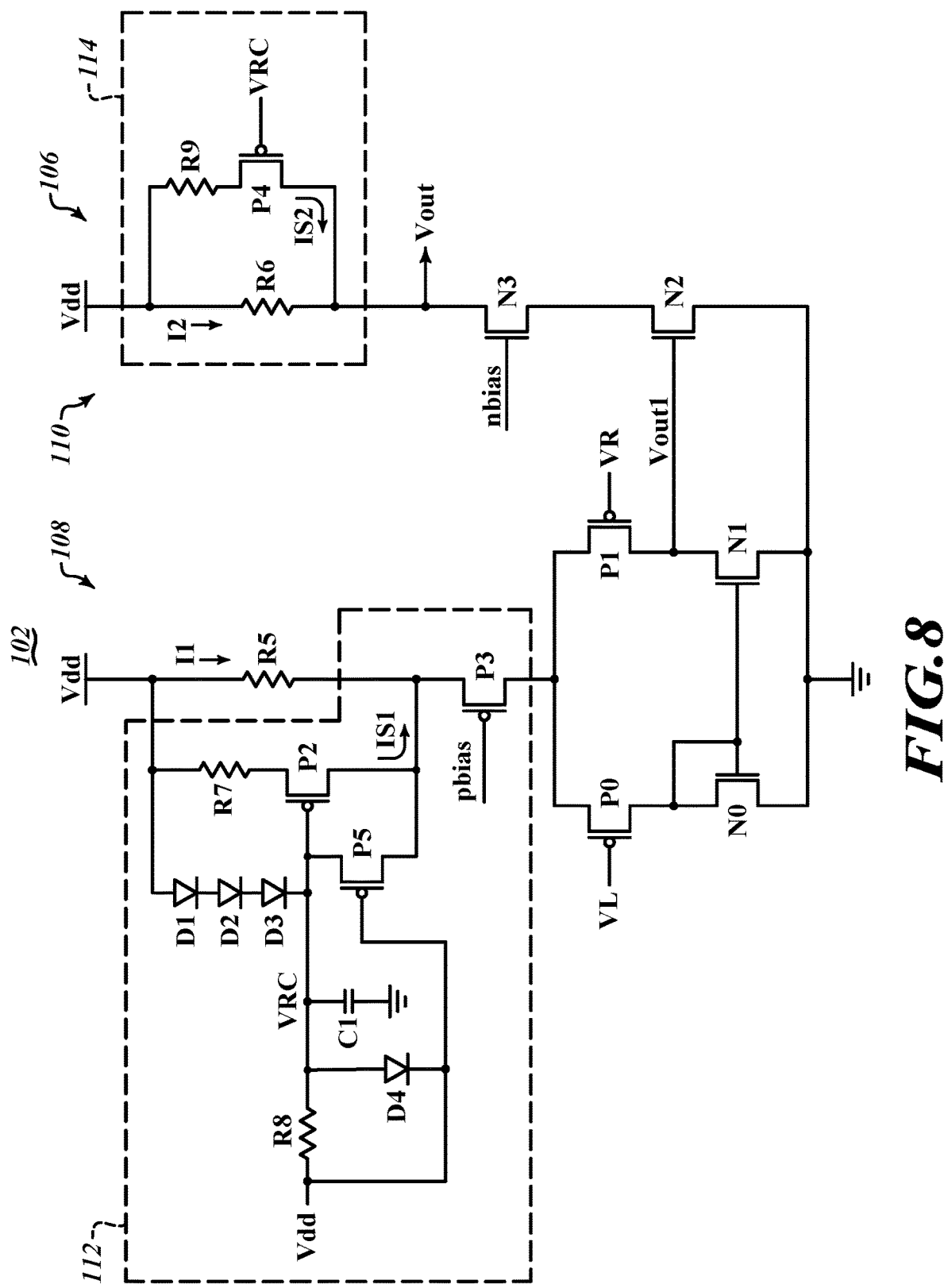
FIG. 8 is a schematic diagram of a supply voltage detector of the integrated circuit, in accordance with one embodiment.

FIG. 8 is a schematic diagram of a supply voltage detector 102, according to one embodiment. The supply voltage detector 102 of FIG. 8 is one example of a supply voltage detector 102 of FIG. 1. The supply voltage detector 102 of FIG. 8 is substantially similar to the supply voltage detector 102 of FIG. 5, except that the startup current booster 112 includes additional circuitry to rapidly discharge the capacitor C1 when VDD ramps down.

In particular, the startup current booster 114 includes a transistor P5 having a source terminal coupled to a gate terminal of the transistor P2 and a drain terminal coupled to the drain terminal of the transistor P2. A diode D4 is coupled between the resistor R8 and the gate terminal of the transistor P5. The gate terminal of the transistor P5 is coupled to the supply voltage VDD. Although the transistor P5 of the diode D4 are illustrated as part of the startup current booster 112, in practice, the diode D4 and the transistor P5 are jointly shared by the startup boosters 112 and 114 because the gate terminals of the transistors P4 and P2 are coupled together and both receive VRC.

When VDD ramps down, VRC is higher than VDD due to the delay in discharging the capacitor C1. The result is that the transistor P5 will be turned on, providing a higher current to discharge the capacitor C1 through the first stage 108 of the comparator. VRC will follow VDD but will be momentarily higher by one threshold voltage of the diode D4. Accordingly, due to the higher currents through the transistor P5, the output voltage V out also goes to 0V when the supply drops below the threshold. When VDD ramps back up again, the capacitor C1 has been discharged and VRC is lower than VDD, thereby turning on the transistors P2 and P4 and activating the supplemental currents IS1 and IS2.

Figure 9:
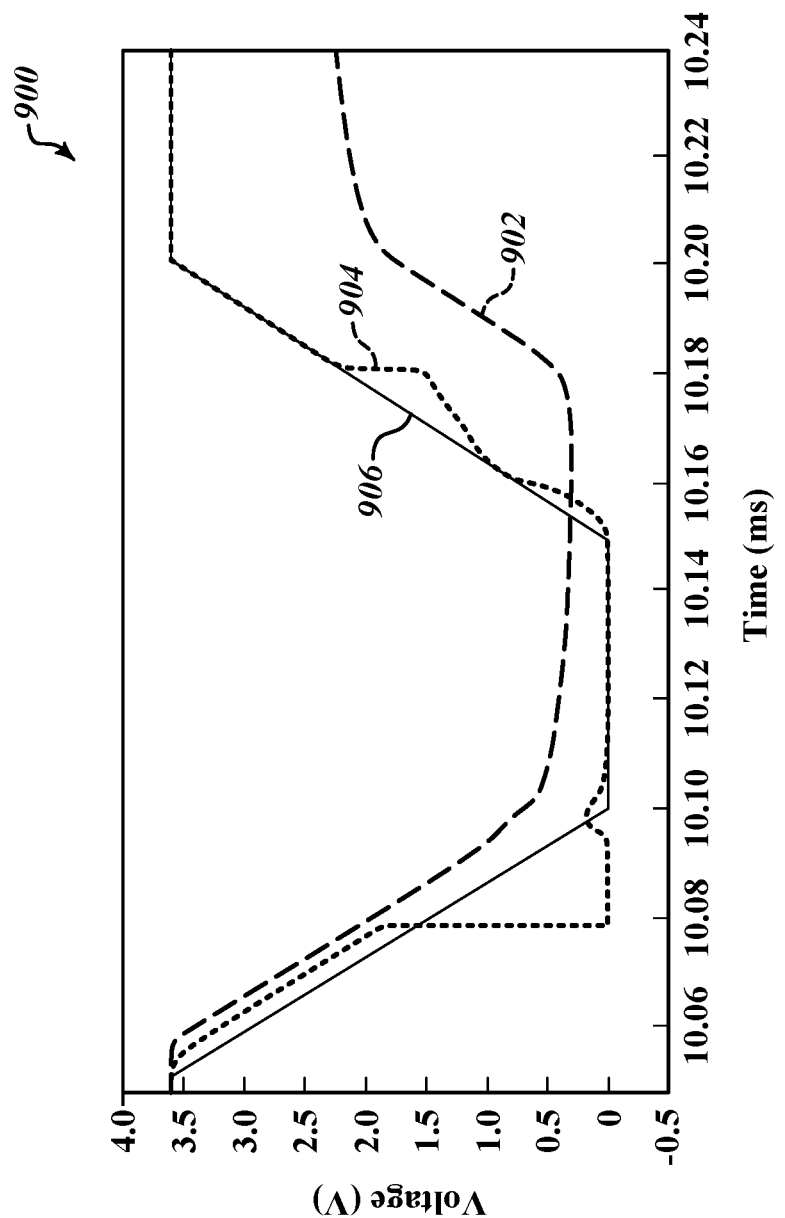
FIG. 9 illustrates graphs of signals associated with a supply voltage detector of an integrated circuit, in accordance with one embodiment.

FIG. 9 is a graph 900 illustrates signals associated with the supply voltage detector 102 of FIG. 8, according to one embodiment. In particular, the curve 902 corresponds to the voltage VRC. The curve 904 corresponds to the output voltage Vout the curve 906 corresponds to the supply voltage VDD. When VDD ramps down, VRC rapidly discharges and Vout goes to 0V. When VDD ramps up again, VRC ramps up and Vout quickly follows VDD.

Figure 10:
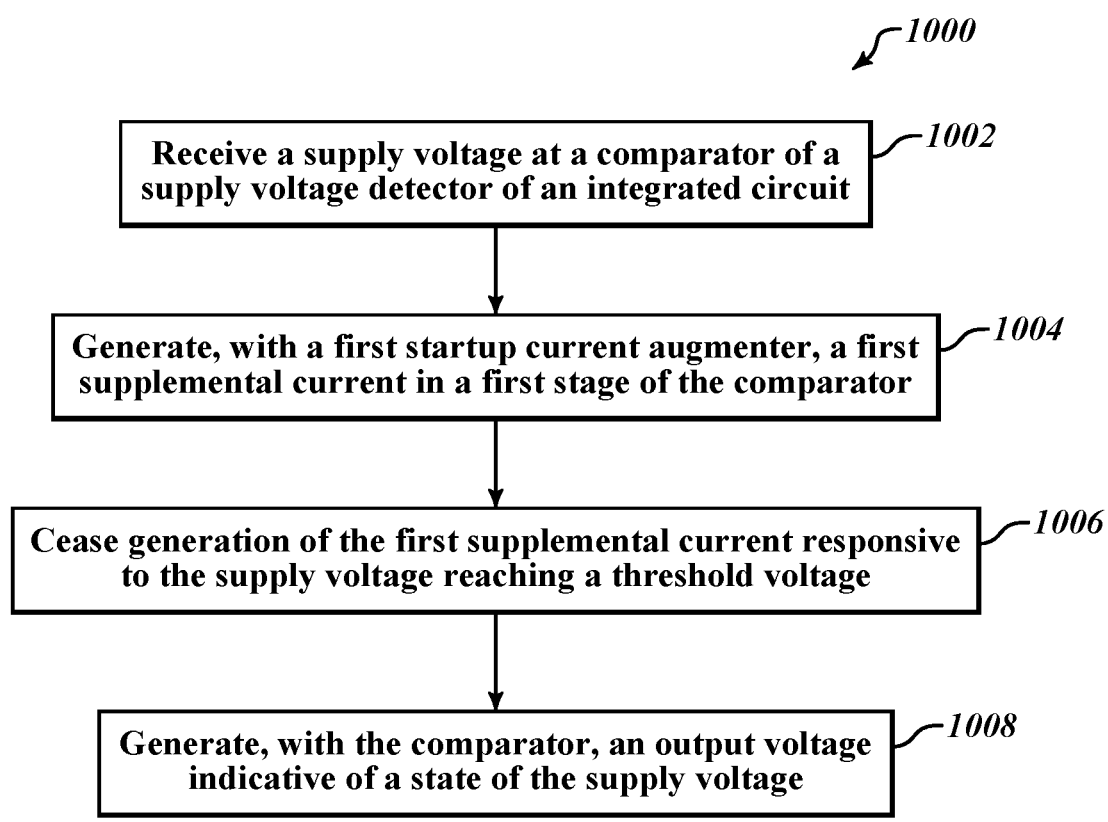
FIG. 10 is a flow diagram of a method for operating an integrated circuit, in accordance with one embodiment.

FIG. 10 is a flow diagram of a method 1000 for operating an integrated circuit, according to one embodiment. The method 1000 can utilize systems, components, and processes described in relation to FIGS. 1-9. At 1002, the method 1000 includes receiving a supply voltage at a comparator of a supply voltage detector of an integrated circuit. At 1004, the method 1000 includes generating, with a first startup current booster, a first supplemental current in a first stage of the comparator. At 1006, the method 1000 includes ceasing generation of the supplemental current responsive to the supply voltage reaching a threshold voltage. At 1008, the method 1000 includes generating, with the comparator, an output voltage indicative of a state of the supply voltage.

Figure 11:
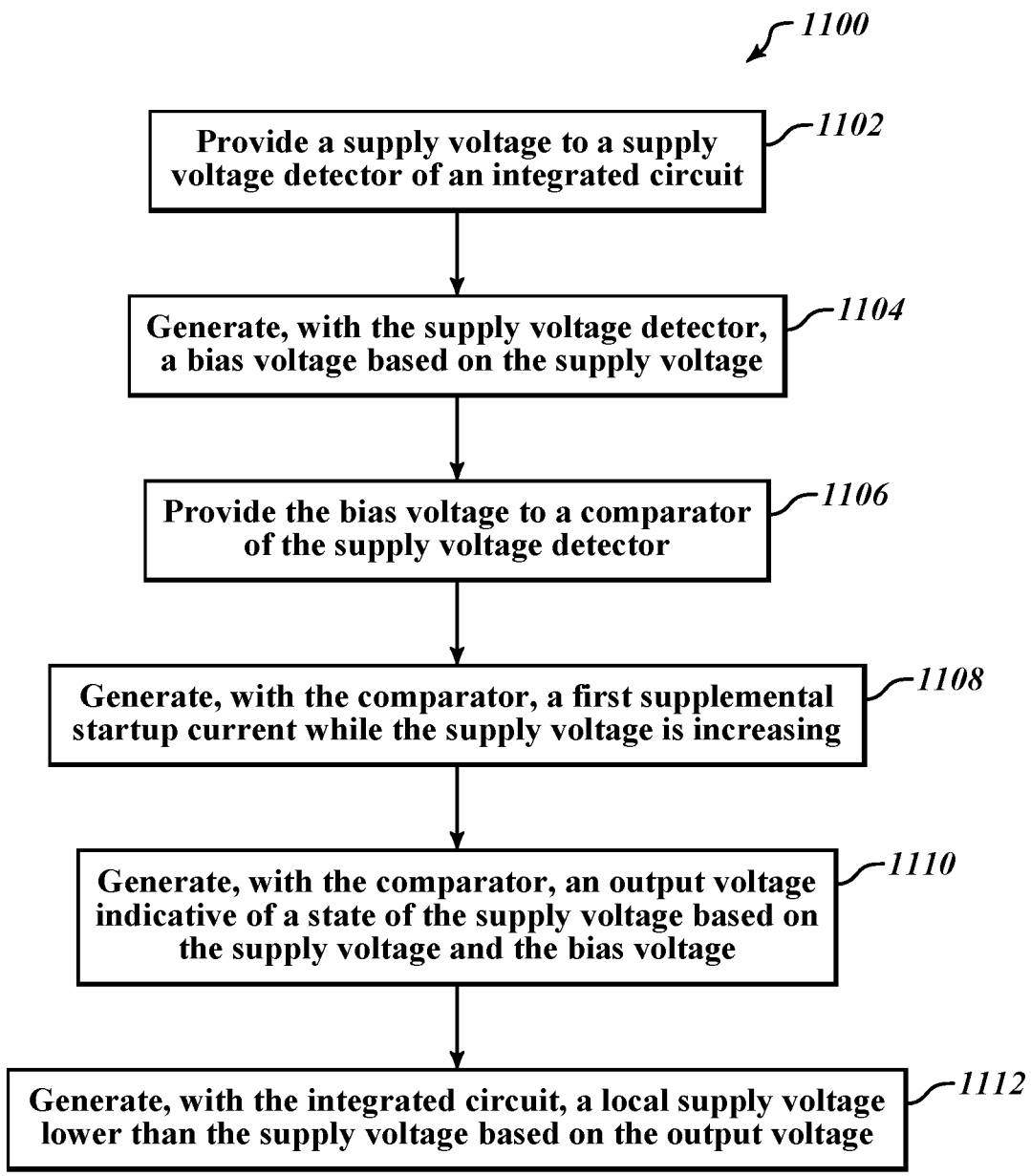
FIG. 11 is a flow diagram of a method for operating an integrated circuit, in accordance with one embodiment.

FIG. 11 is a flow diagram of a method 1100 for operating an integrated circuit, according to one embodiment. The method 1100 can utilize systems, components, and processes described in relation to FIGS. 1-9. At 1102, the method 1100 includes providing a supply voltage to a supply voltage detector of an integrated circuit. At 1104, the method 1100 includes generating, with the supply voltage detector, a bias voltage based on the supply voltage. At 1106, the method 1100 includes providing the bias voltage to a comparator of the supply voltage detector. At 1108, the method 1100 includes generating, with the comparator, a first supplemental startup current while the supply voltage is increasing. At 1110, the method 1100 includes generating, with the comparator, an output voltage indicative of a state of the supply voltage based on the supply voltage and the bias voltage. at 1112, the method 1100 includes generating, with the integrated circuit, a local supply voltage lower than the supply voltage based on the output voltage.

In one embodiment, a method includes receiving a supply voltage at a comparator of a supply voltage detector of an integrated circuit and generating, with a first startup current booster, a first supplemental current in a first stage of the comparator. The method includes ceasing generation of the supplemental current responsive to the supply voltage reaching a threshold voltage and generating, with the comparator, an output voltage indicative of a state of the supply voltage.

In one embodiment, a method includes providing a supply voltage to a supply voltage detector of an integrated circuit and generating, with the supply voltage detector, a bias voltage based on the supply voltage. The method includes providing the bias voltage to a comparator of the supply voltage detector and generating, with the comparator, a first supplemental startup current while the supply voltage is increasing. The method includes generating, with the comparator, an output voltage indicative of a state of the supply voltage based on the supply voltage and the bias voltage and generating, with the integrated circuit, a local supply voltage lower than the supply voltage based on the output voltage.

In one embodiment, an integrated circuit includes a supply voltage detector including a bias voltage generator configured to generate a first bias voltage based on a supply voltage and a comparator coupled to the bias voltage generator. The comparator is configured to receive the first bias voltage and the supply current and to generate an output voltage indicative of a state of the supply voltage based on the bias voltage. The comparator includes a startup current booster configured to generate a first supplemental current in the comparator.

In one embodiment, an integrated circuit includes a supply voltage detector including a bias voltage generator configured to generate a first bias voltage, a second bias voltage, and a third bias voltage based on a supply voltage and a comparator. The comparator is coupled to the bias voltage generator and is configured to receive the first bias voltage, the second bias voltage, the third bias voltage, and the supply voltage. The comparator includes a first stage configured to receive the first bias voltage and the second bias voltage and to generate a preliminary output voltage based on the first bias voltage and the second bias voltage and including a first boost current generator configured to generate a second supplement current for the first stage while the supply voltage is ramping up. The comparator includes a second stage configured to receive the third bias voltage and the preliminary output voltage and to generate an output voltage based on the third bias voltage and the preliminary output voltage and including a second boost current generator configured to generate a second supplement current for the second stage while the supply voltage is ramping up. The integrated circuit includes a local supply voltage generator configured to generate a local supply voltage from the supply voltage based on the output voltage, the local supply voltage being lower than the supply voltage.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

receiving a supply voltage at a comparator of a supply voltage detector of an integrated circuit;

generating, with a first startup current booster, a first supplemental current in a first stage of the comparator;

ceasing generation of the first supplemental current responsive to the supply voltage reaching a threshold voltage;

generating, with the comparator, an output voltage indicative of a state of the supply voltage;

generating, with a second startup current booster, a second supplemental current in a second stage of the comparator;

ceasing generation of the second supplemental current responsive to the supply voltage reaching the threshold voltage; generating, with a bias voltage generator of the supply voltage detector, a first bias voltage and a second bias voltage based on the supply voltage;
providing the first bias voltage to a gate terminal of a first transistor of the first stage; and
providing the second bias voltage to a gate terminal of a second transistor of the first stage.

2. The method of claim 1, comprising:
receiving, with a local supply generator of the integrated circuit, the supply voltage; and
generating, with the local supply generator of the integrated circuit, a local supply voltage based on the output voltage.

3. The method of claim 2, wherein the local supply voltage is lower than the supply voltage.

4. The method of claim 1, comprising:
passing a first current through a first resistor between the supply voltage and a common source terminal of the first and second transistors; and
passing the first supplemental current through a second resistor and a third transistor coupled in parallel with the first resistor.

5. The method of claim 4, comprising charging a gate terminal of the third transistor via a third resistor coupled between the supply voltage and the gate terminal of the third transistor, a capacitor being coupled between the gate terminal of the third transistor and ground.

6. The method of claim 5, wherein a plurality of first diodes are coupled in series between the supply voltage and the gate terminal of the third transistor.

7. The method of claim 6, comprising discharging the gate terminal of the third transistor by activating a fourth transistor coupled between the gate terminal of the third transistor and the first resistor responsive to a reduction of the supply voltage.

8. The method of claim 5, comprising:
passing a second current through a fourth resistor coupled between the supply voltage and an output terminal of the second stage;
passing the second supplemental current through a fifth resistor and a sixth transistor couple in parallel with the fifth resistor.

9. The method of claim 8, comprising:
generating, with the bias voltage generator, a third bias voltage and a fourth bias voltage;
providing the third bias voltage to a gate terminal of a seventh transistor coupled between the first resistor and the common source terminal;
providing the fourth bias voltage a gate terminal of an eighth transistor coupled between the output terminal and a ninth transistor coupled between the eighth transistor and ground;
generating a preliminary output voltage with the first stage; and
providing the preliminary output voltage to a gate terminal of the ninth transistor.

10. A method, comprising:
providing a supply voltage to a supply voltage detector of an integrated circuit;
generating, with the supply voltage detector, a first bias voltage based on the supply voltage;
providing the first bias voltage to a comparator of the supply voltage detector;
generating, with the comparator, a first supplemental current while the supply voltage is increasing;
generating, with the comparator, an output voltage indicative of a state of the supply voltage based on the supply voltage and the bias voltage;

generating, with the integrated circuit, a local supply voltage lower than the supply voltage based on the output voltage;
generating, with the bias voltage generator, a second bias voltage based on the supply voltage;
providing the first bias voltage to a gate terminal of a first transistor of the comparator; and
providing the second bias voltage to a gate terminal of a second transistor of the comparator.

11. The method of claim 10, comprising:
passing a first current through a first resistor between the supply voltage and a common source terminal of the first and second transistors; and
passing the first supplemental current through a second resistor and a third transistor couple in parallel with the first resistor.

12. The method of claim 11, comprising charging a gate terminal of the third transistor via a third resistor coupled between the supply voltage and the gate terminal of the third transistor, a capacitor being coupled between the gate terminal of the third transistor and ground.

13. An integrated circuit, comprising:
a supply voltage detector including:
    a bias voltage generator configured to generate a first bias voltage, a second bias voltage, and a third bias based on a supply voltage; and
    a comparator coupled to the bias voltage generator and configured to receive the first bias voltage and the supply voltage and to generate an output voltage indicative of a state of the supply voltage based on the first bias voltage, the comparator including:
    a first stage configured to receive the first bias voltage and the second bias voltage and to generate a preliminary output voltage based on the first bias voltage and the second bias voltage and including a first boost current generator configured to generate a first supplemental current for the first stage while the supply voltage is ramping up; and
    a second stage configured to receive the third bias voltage and the preliminary output voltage and to generate the output voltage based on the third bias voltage and the preliminary output voltage and including a second boost current generator configured to generate a second supplemental current for the second stage while the supply voltage is ramping up; and
a local supply voltage generator configured to generate a local supply voltage lower than the supply voltage based on the output voltage.

14. The integrated circuit of claim 13, wherein:
the first stage includes:
    a first transistor configured to receive the first bias voltage on a gate terminal of the first transistor;
    a second transistor configured to receive the second bias voltage on a gate terminal of the second transistor; and
    a first resistor couped between the supply voltage and common source terminal of the first and second transistors;
the first boost current generator includes:
    a second resistor and a third transistor coupled together and in parallel with the first resistor and configured to pass the supplemental current to the common source terminal;
    a third resistor coupled between the supply voltage and the gate terminal of the third transistor; and a capacitor coupled between the gate terminal of the third transistor and ground.

15. The integrated circuit of claim 14, wherein:

the second stage includes:
- an output terminal;
- a fourth resistor coupled between the supply voltage and the output terminal;
- a fourth transistor coupled between the output terminal and ground and configured to receive the third bias voltage;

the second boost current generator includes:
- a fifth resistor and a fifth transistor coupled together and in parallel with the fourth resistor, a gate terminal of the fifth transistor being coupled to the gate terminal of the third transistor.

16. The integrated circuit of claim 14, wherein the first and second transistors are P-type transistors.

17. The integrated circuit of claim 14, wherein the third transistor is a P-type transistor.

18. The integrated circuit of claim 15, wherein the fourth transistor is an N-type transistor.

19. The integrated circuit of claim 18, wherein the fifth transistor is a P-type transistor.

\* \* \* \* \*